(12) United States Patent
LaForet et al.

(10) Patent No.: US 9,972,714 B2
(45) Date of Patent: May 15, 2018

(54) SEMICONDUCTOR DEVICE WITH A TERMINATION MESA BETWEEN A TERMINATION STRUCTURE AND A CELL FIELD OF FIELD ELECTRODE STRUCTURES

(71) Applicant: Infineon Technologies Austria AG, Villach (AT)

(72) Inventors: David LaForet, Villach (AT); Ralf Siemieniec, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days. days.

(21) Appl. No.: 14/837,488

(22) Filed: Aug. 27, 2015

(65) Prior Publication Data

US 2016/0064548 A1 Mar. 3, 2016

(30) Foreign Application Priority Data

Aug. 28, 2014 (DE) .................. 10 2014 112 379

(51) Int. Cl.
*H01L 29/76* (2006.01)
*H01L 29/94* (2006.01)
(Continued)

(52) U.S. Cl.
CPC .... *H01L 29/7811* (2013.01); *H01L 21/02233* (2013.01); *H01L 29/0696* (2013.01);
(Continued)

(58) Field of Classification Search
CPC .............. H01L 29/7811; H01L 29/407; H01L 29/7813; H01L 29/0696; H01L 29/404;
(Continued)

(56) References Cited

U.S. PATENT DOCUMENTS

| 7,648,879 B2 | 1/2010 | Banerjee et al. |
| 2008/0038891 A1 | 2/2008 | Cho |

(Continued)

FOREIGN PATENT DOCUMENTS

| DE | 10 2004 009 602 A1 | 9/2005 |
| DE | 10 2006 007 096 A1 | 8/2007 |

(Continued)

OTHER PUBLICATIONS

Office Action communication of the Korean Patent and Trademark Office for Appln. Ser. No. 10-2015-0121869, dated Aug. 28, 2015.

(Continued)

*Primary Examiner* — Shouxiang Hu
(74) *Attorney, Agent, or Firm* — Slater Matsil, LLP

(57) ABSTRACT

A semiconductor device includes a cell field with a plurality of field electrode structures and cell mesas. The field electrode structures are arranged in lines. The cell mesas separate neighboring ones of the field electrode structures from each other. Each field electrode structure includes a field electrode and a field dielectric separating the field electrode from a semiconductor body. A termination structure surrounds the cell field, extends from a first surface into the semiconductor body, and includes a termination electrode and a termination dielectric separating the termination electrode from the semiconductor body. The termination and field dielectrics have the same thickness. A termination mesa, which is wider than the cell mesas, separates the termination structure from the cell field.

15 Claims, 16 Drawing Sheets

(51) Int. Cl.
*H01L 29/78* (2006.01)
*H01L 29/40* (2006.01)
*H01L 29/06* (2006.01)
*H01L 21/02* (2006.01)
*H01L 29/66* (2006.01)
*H01L 29/423* (2006.01)
*H01L 29/739* (2006.01)

(52) U.S. Cl.
CPC .......... *H01L 29/404* (2013.01); *H01L 29/407* (2013.01); *H01L 29/4236* (2013.01); *H01L 29/66734* (2013.01); *H01L 29/7393* (2013.01); *H01L 29/7397* (2013.01); *H01L 29/7813* (2013.01); *H01L 21/02255* (2013.01); *H01L 29/0638* (2013.01)

(58) Field of Classification Search
CPC ........... H01L 21/02233; H01L 29/0638; H01L 21/02255; H01L 29/0878; H01L 29/66734; H01L 29/4236; H01L 29/7397; H01L 29/402; H01L 29/0634; H01L 29/7802; H01L 29/4238
USPC ........ 257/330, 334, 328, 331, 341, 409, 496
See application file for complete search history.

(56) References Cited

U.S. PATENT DOCUMENTS

| | | |
|---|---|---|
| 2009/0079002 A1 | 3/2009 | Lee |
| 2011/0136309 A1* | 6/2011 | Grivna .................. H01L 29/407 438/270 |
| 2012/0061753 A1* | 3/2012 | Nishiwaki ............. H01L 29/407 257/331 |
| 2012/0153386 A1 | 6/2012 | Hirler |

FOREIGN PATENT DOCUMENTS

| | | |
|---|---|---|
| DE | 10 2005 052 734 B4 | 2/2012 |
| DE | 10 2014 101 164 A1 | 7/2014 |
| JP | 2008013683 | 5/2008 |
| JP | 2013175596 A | 9/2013 |
| KR | 20070024365 | 3/2007 |

OTHER PUBLICATIONS

Translator's Report re: Office Action Communication of the German Patent and Trademark Office for File Reference 10 2014 112 379.4, dated Jul. 31, 2015.
Office Action communication of the Korean Patent and Trademark Office for Appln. Ser. No. 102014112379.4, dated Apr. 14, 2017.

* cited by examiner

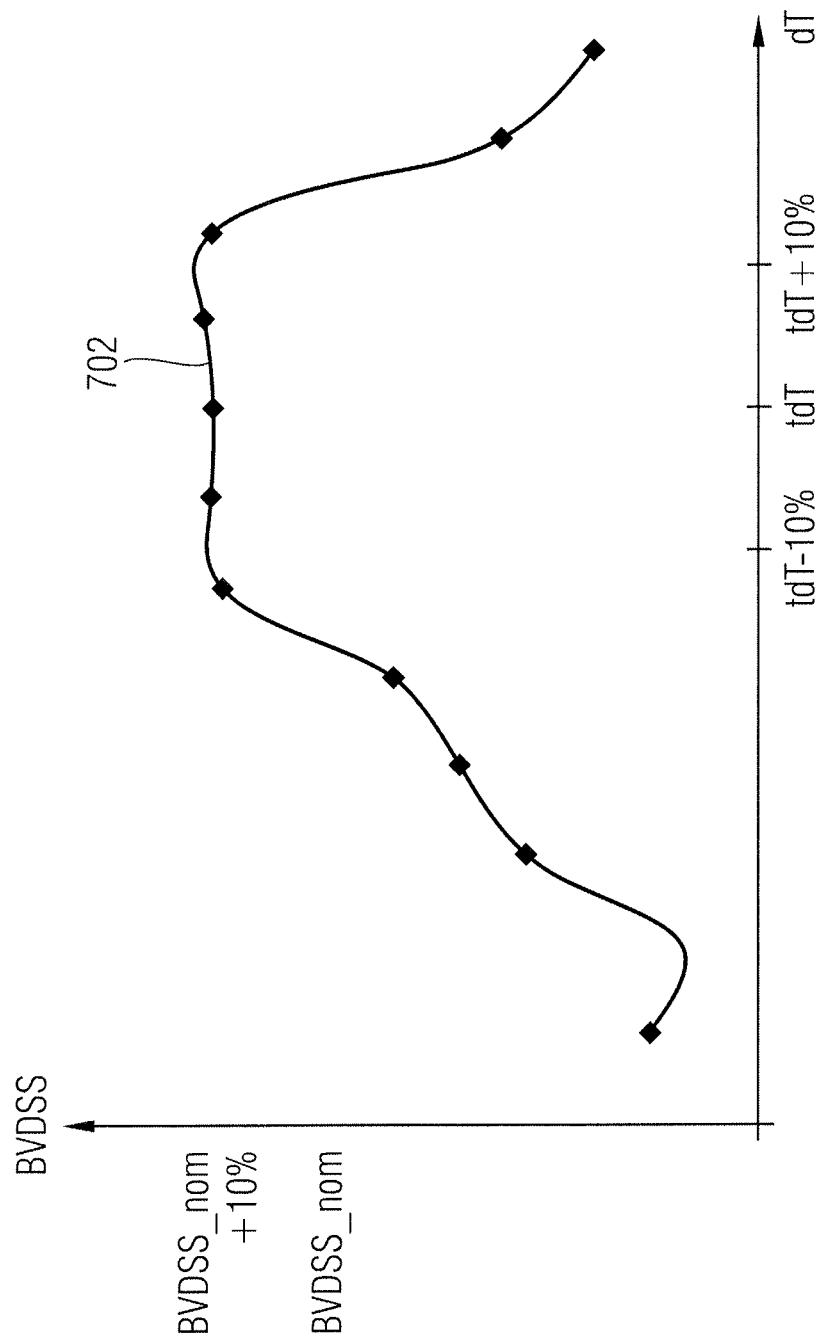

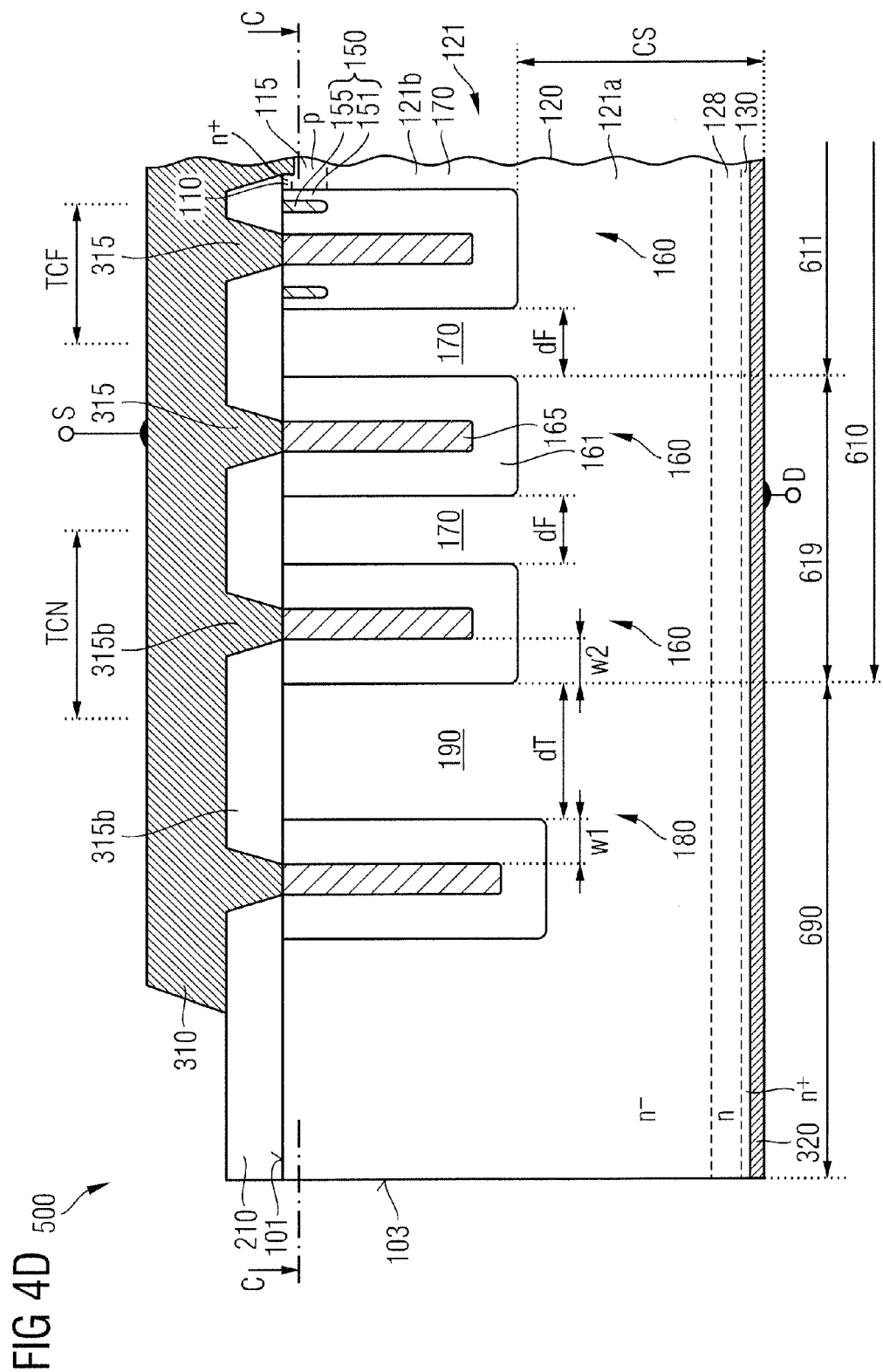

SEMICONDUCTOR DEVICE WITH A TERMINATION MESA BETWEEN A TERMINATION STRUCTURE AND A CELL FIELD OF FIELD ELECTRODE STRUCTURES

CROSS REFERENCE TO RELATED APPLICATION

This application claims priority to German Application Serial No. 102014112379.4 filed Aug. 28, 2014 and entitled "Semiconductor Device with a Termination Mesa Between a Termination Structure and a Cell Field of Field Electrode Structures".

BACKGROUND

Power semiconductor devices based on IGFET (insulated gate field effect transistor) cells are typically vertical devices with a load current flow between a first surface at a front side of a semiconductor die and a second surface at a rear side. In a blocking mode, stripe-shaped compensation structures extending from the front side into the semiconductor die deplete semiconductor mesas formed between the stripe-shaped compensation structures. The compensation structures allow higher dopant concentrations in the semiconductor mesas without adverse impact on the blocking capabilities. Higher dopant concentrations in turn reduce the on state resistance of the device. Typically, termination structures shape end portions of the semiconductor mesas at the edge of a cell field including the IGFET cells in a way that the doping to be depleted at the end portions is approximately equal to the doping depleted in a central portion of the cell field.

It is desirable to provide semiconductor devices with low ohmic losses and non-problematic avalanche characteristics.

SUMMARY

According to an embodiment a semiconductor device includes a cell field including a plurality of field electrode structures and cell mesas. The field electrode structures are arranged in lines. The cell mesas separate neighboring ones of the field electrode structures from each other. Each field electrode structure includes a field electrode and a field dielectric separating the field electrode from a semiconductor body. A termination structure surrounds the cell field. The termination structure extends from a first surface into the semiconductor body and includes a termination electrode and a termination dielectric separating the termination electrode from the semiconductor body. The termination and field dielectrics have a same thickness. A termination mesa, which is wider than the cell mesas, separates the termination structure from the cell field.

According to another embodiment an electronic assembly includes a semiconductor device. The semiconductor device includes a cell field including a plurality of field electrode structures and cell mesas. The field electrode structures are arranged in lines. The cell mesas separate neighboring ones of the field electrode structures from each other. Each field electrode structure includes a field electrode and a field dielectric separating the field electrode from a semiconductor body. A termination structure surrounds the cell field. The termination structure extends from a first surface into the semiconductor body and includes a termination electrode and a termination dielectric separating the termination electrode from the semiconductor body. The termination and field dielectrics have a same thickness. A termination mesa, which is wider than the cell mesas, separates the termination structure from the cell field.

According to another embodiment a method of manufacturing a semiconductor device includes forming, in a cell field of a semiconductor layer that contains dopants, field electrode trenches, wherein the field electrode trenches are arranged in lines and are separated by cell mesas formed from portions of the semiconductor layer. In the semiconductor layer, a termination trench is formed that surrounds the cell field, wherein a portion of the semiconductor layer between the cell field and the termination trench forms a termination mesa, which is wider than the cell mesas. By thermal oxidation a field oxide layer is formed that equably lines the field electrode and termination trenches.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3 is a schematic diagram plotting the breakdown voltage as a function of the width of the termination mesa for illustrating effects of the embodiments.

FIG. 4D is a schematic vertical cross-sectional view of the semiconductor device portion of FIG. 4C along line D-D.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
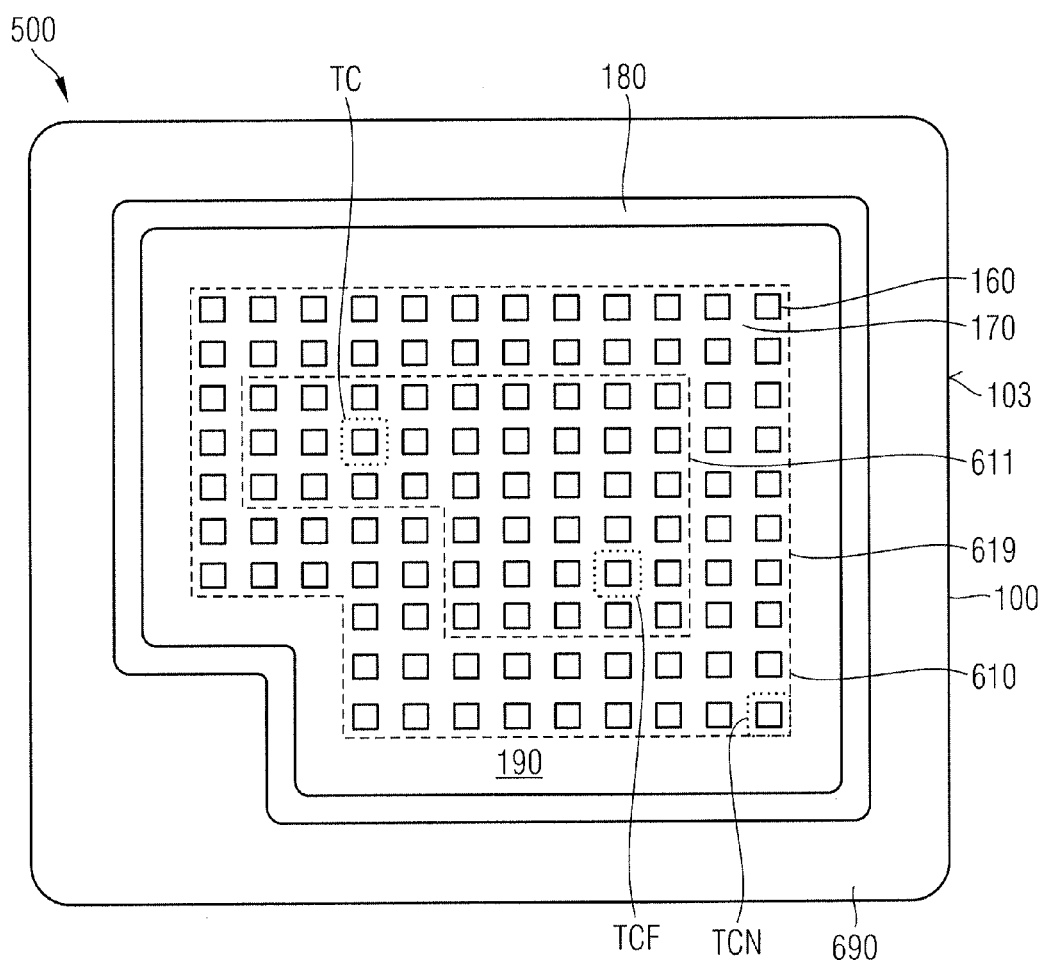
FIG. 1A is a schematic plan view of a semiconductor device according to an embodiment related to a circumferential termination structure and a termination mesa which is wider than cell mesas.
Figure 1B:
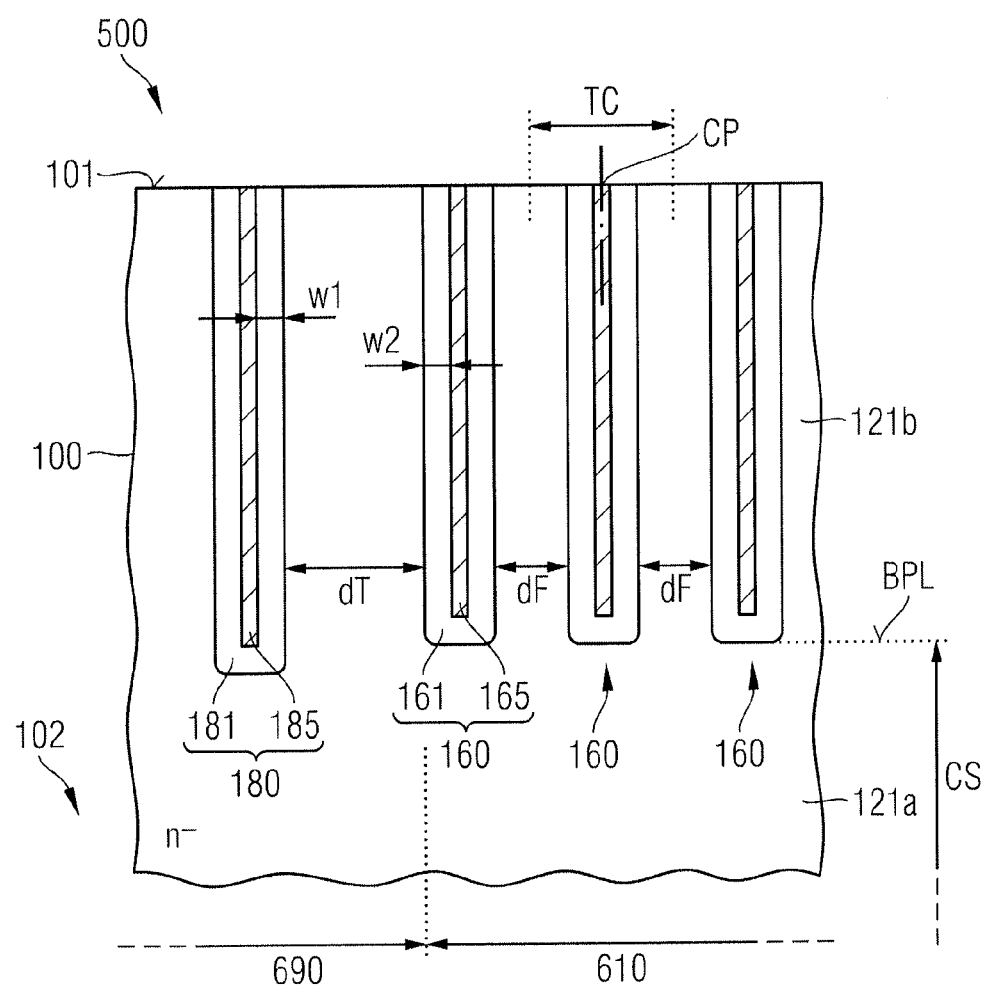
FIG. 1B is a schematic vertical cross-sectional view of a portion of the semiconductor device of FIG. 1A.

FIGS. 1A to 1B refer to a semiconductor device 500 including a plurality of identical IGFET (insulated gate field effect transistor) cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT.

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections as well as a planar second surface 102 parallel to the first surface 101. A distance between the first and second surfaces 101, 102 is defined by a specified voltage blocking capability and may be at least 20 μm. According to other embodiments, the distance may be in the range of several hundred micrometer. A lateral surface 103, which is tilted to the first and second surfaces 101, 102 connects the first and second surfaces 101, 102.

In a plane parallel to the first surface 101 the semiconductor body 100 may have a rectangular shape with an edge length of several millimeters. A normal to the first surface 101 defines a vertical direction and directions orthogonal to the vertical direction are horizontal directions.

Each transistor cell TC includes a field electrode structure 160 extending from the first surface 101 into the semiconductor body 100 down to a bottom plane BPL. Each field electrode structure 160 includes a conductive spicular or needle-shaped field electrode 165 and a field dielectric 161 surrounding the field electrode 165.

The field electrode 165 includes or consists of a heavily doped polycrystalline silicon layer and/or a metal-containing layer. The field dielectric 161 separates the field electrode 165 from the surrounding semiconductor material of the semiconductor body 100 and includes or consists of a thermally grown silicon oxide layer. According to an embodiment, the field dielectric 161 may further include a deposited silicon oxide layer, e.g., a silicon oxide layer based on TEOS (tetraethyl orthosilicate).

A vertical extension of the field electrode structures 160 is smaller than a distance between the first surface 101 and the second surface 102 such that a contiguous section CS of the semiconductor body 100 is formed between the field electrode structures 160 and the second surface 102. The vertical extension of the field electrode structures 160 may be in a range from 0.5 μm to 50 μm, for example in a range from 0.6 μm to 4.0 μm.

A first horizontal extension of the field electrode 165 may be at most three times or at most twice as large as a second horizontal extension orthogonal to the first horizontal extension. The horizontal extensions may be in a range from 0.4 µm to 10 µm, for example in a range from 0.6 µm to 4.0 µm.

The cross-sectional areas of the field electrodes 165 and the field electrode structures 160 may be ellipses, ovals, rectangles, or regular or distorted polygons, with or without rounded and/or beveled corners, respectively. According to an embodiment, the first and second horizontal extensions are approximately equal and the cross-sectional areas of the field electrodes 165 and the field electrode structures 160 are circles or regular polygons such as octagons, hexagons or squares, with or without rounded or beveled corners, respectively.

The field electrode structures 160, which are centered on a horizontal center point CP of the transistor cells TC, are equally spaced and may be arranged matrix-like in lines and rows in a cell field 610. According to other embodiments, the field electrode structures 160 may be arranged in shifted lines, wherein the odd lines are shifted with respect to the even lines by half the distance between two field electrode structures 160. Semiconducting portions of the transistor cells TC are formed in cell mesas 170 of the semiconductor body 100, wherein the cell mesas 170 protrude from the contiguous section CS of the semiconductor body 100, surround the field electrode structures 160 and form a grid with the field electrode structures 160 arranged in the meshes.

The cell mesas 170 include a second drift zone section 121b of a first conductivity type directly adjoining a first drift zone section 121a, which has the same conductivity type and which is formed in the contiguous section CS of the semiconductor body 100 between the bottom plane BPL and the second surface 102. A dopant concentration in the second drift zone section 121b may be equal to a dopant concentration in the first drift zone section 121a. A mean dopant concentration in a drift zone 121 including the first and second drift zone sections 121a, 121b may be between 1E15 cm$^{-3}$ and 1E17 cm$^{-3}$, for example in a range from 5E15 cm$^{-3}$ to 5E16 cm$^{-3}$.

Outer edges of the outermost field electrode structures 160 define the contour of the cell field 610. The cell field 610 may include a central portion 611 including functional transistor cells TCF including source zones of the first conductivity type and body zones of a second, complementary conductivity type, wherein the body zones separate the source zones from the second drift zone section 121b. The functional transistor cells TCF further include portions of a gate structure including a gate electrode capacitively coupled to the body zones through a gate dielectric.

The cell field 610 may further include a transition area 619 including non-functional transistor cells TCN. In the non-functional transistor cells TCN the cell mesas 170 may be devoid of source zones or may be devoid of both source zones and body zones such that in the cell mesas 170 of the transition area 619 the second drift zone section 121b directly adjoins the first surface 101. The non-functional transistor cells TCN may or may not be devoid of gate electrode structures. The transition area 619 may surround the central portion 611 completely and at uniform width.

A termination structure 180 completely surrounds the cell field 610 in the horizontal plane. The termination structure 180 extends in an edge area 690 surrounding the cell field 610 from the first surface 101 into the semiconductor body down to at least the bottom plane BPL. The termination structure 180 includes a termination electrode 185 and a termination dielectric 181 surrounding the termination electrode 185.

The termination electrode 185 includes or consists of a heavily doped polycrystalline silicon layer and/or a metal-containing layer. The termination dielectric 181 separates the termination electrode 185 from the surrounding semiconductor material of the semiconductor body 100 and includes or consists of a thermally grown silicon oxide layer. According to an embodiment, the termination dielectric 181 may further include a deposited silicon oxide layer, e.g. a silicon oxide based on TEOS. The vertical extension of the termination structure 180 is equal to or greater than the vertical extension of the field electrode structures 160. A width of the termination structure 180 may be equal to or greater than a horizontal dimension of the field electrode structures 160.

The termination and field dielectrics 181, 161 have the same thickness and the same configuration. In other words, the termination and field dielectrics 181, 161 have the same layered structure. For example, if both termination and field dielectrics 181, 161 consist of thermally grown semiconductor oxide, e.g. silicon oxide, the thickness w2 of the field dielectrics 161 is equal to the thickness w1 of the termination dielectric 181. If the termination and field dielectrics 181, 161 include a deposited oxide layer, the thickness of the deposited oxide layer is the same in the field and the termination dielectrics 161, 181.

A termination mesa 190 separates the termination structure 180 from the cell field 610. A width dT of the termination mesa 190 is greater than a width dF of the cell mesas 170.

The cell mesas 170 and the termination mesa 190 may result from a semiconductor layer, e.g., an epitaxial layer with an initial background doping. The thermal growth of the field and termination dielectrics 161, 181 releases dopants from the consumed portions of the semiconductor body 100. The amount of dopants released during the oxide growth from vertical sidewalls of the field and termination dielectrics 161, 181 is the same in both the cell mesas 170 and the termination mesa 190. Since the termination mesa 190 is wider, the same amount of additional dopants diffuses into a greater volume in the termination mesa 190 than in the cell mesa 170. The resulting mean dopant concentration in the termination mesa 190 is lower than the resulting mean dopant concentration in the second drift zone section 121b in the cell mesas 170.

When matching the blocking capability of a field electrode structure 160 that includes a needle-shaped field electrode 165 with the blocking capability of a stripe cell at the same vertical extension and the same mesa width of both cells, the field electrode structure 160 with the needle-shaped field electrode gets along with a thinner field dielectric 161 at a higher dopant concentration in the cell mesa assigned to the needle-shaped field electrode.

In contrast, the wider termination structure 180 according to the embodiments allows to match the blocking capability of the rather stripe-shaped termination structure 180 with that of the needle-shaped field electrode structures 160 such that avalanche breakdown mainly takes place in the more robust cell field 610 instead along the termination mesa 170. The effect is achieved with the field dielectric 161 and the termination dielectric 181 having the same thickness w1=w2 such that field and termination dielectrics 161, 181 may emerge from the same processes and without additional lithography-based patterning process. In addition, by using segregation of dopants during oxide growth, the embodiments allow a difference between the dopant concentration in the termination mesa 190 and the dopant concentration in the cell mesas 170 to be implemented without a lithography-based patterning step.

Figure 2A:
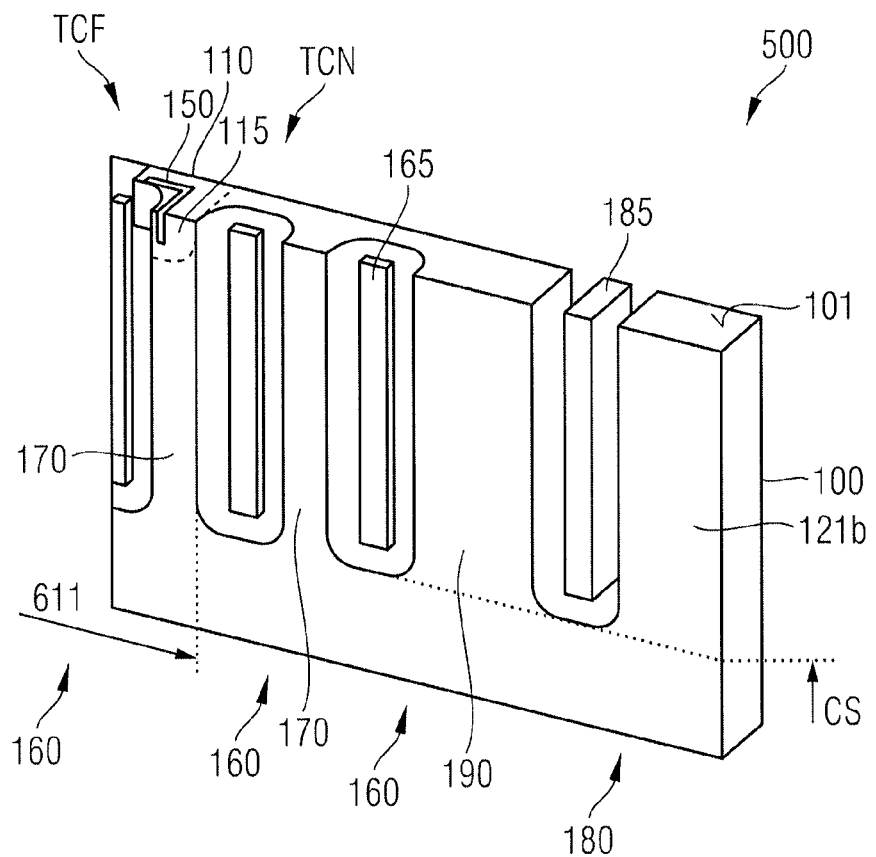
FIG. 2A is a schematic perspective cross-sectional view of a portion of a semiconductor device according to an embodiment.
Figure 2B:
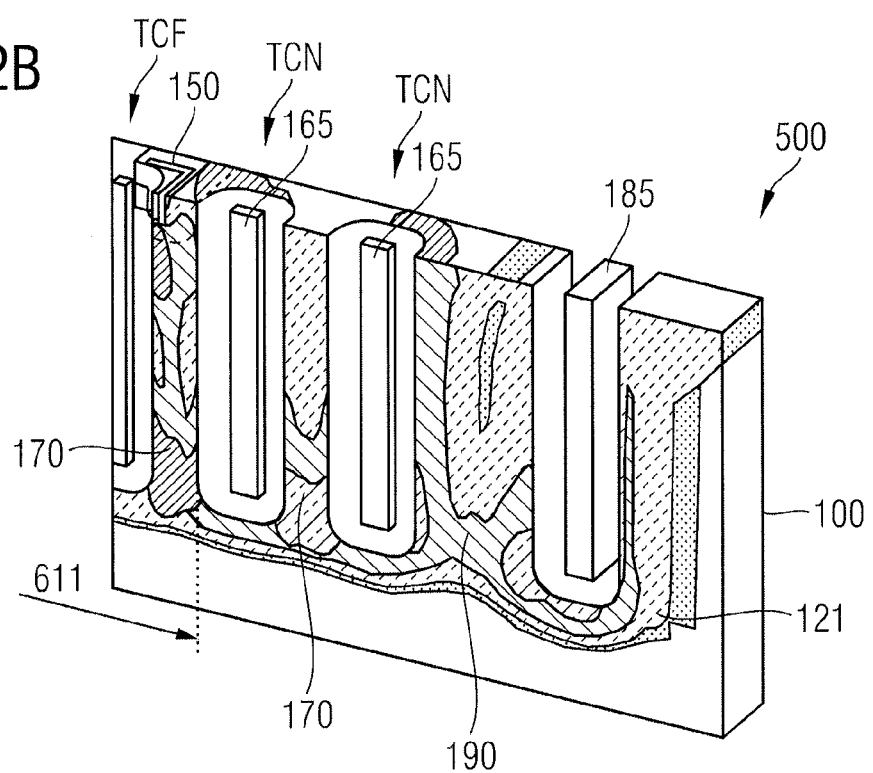
FIG. 2B shows charge carrier generation at avalanche breakdown in the semiconductor device portion of FIG. 2A.

FIGS. 2A and 2B refer to a configuration of spicular field electrode structures 160 and a stripe-shaped termination structure 180 similar to that depicted in FIG. 1B, wherein in the central portion 611 of the cell field 610 functional transistor cells TCF include a source zone 110, a body zone 115 separating the source zone 110 from the drift zone 121 and a gate structure 150 for controlling an inversion channel through the respective body zone 115.

FIG. 2B illustrates the distribution of charge carrier generation in the semiconductor body 100 in case of an avalanche breakdown, wherein dense shading corresponds to high generation rates and sparse shading corresponds to low generation rates. The higher generation rates occur in the central portion 611. Since the central portion 611 has the greater area portion, an avalanche breakdown distributes over a greater part of the chip area and the generated heat distributes over a greater portion of the semiconductor volume. The semiconductor device 500 can more reliable recover from the avalanche breakdown than it would if the avalanche generation takes place only in a small area portion, e.g., along the termination mesa 180.

In a semiconductor device according to a comparative example with a higher avalanche generation rate in the termination mesa 190 than in the cell mesas 170, the avalanche generation concentrates in a comparatively small area portion and local current filaments may occur that can locally destroy the semiconductor lattice such that the concerned semiconductor devices harder recover from the avalanche state with time or are irreversibly damaged.

The breakdown voltage BVDSS of stripe-shaped transistor cells can be examined for a given thickness w2 of the field dielectric along the cell mesas as a function of both the dopant concentration in the cell mesas and the vertical extension of the field electrode structure up to a width of the stripe-shaped cell mesas of about 1.2 µm. The obtained values can be extrapolated for widths of the cell mesas beyond 1.5 µm. In this way process windows for the termination mesa 190 may be obtained for any given thickness w1 of the termination dielectric 181.

FIG. 3 shows a process window 702 for a target width tdT of the termination mesa 190 by plotting the breakdown voltage BVDSS against the width dT of the termination mesa 190 for a thickness w1 of the termination dielectric of about 450 nm. The pertinent process window 702 indicates that a deviation of more than ±10% from a target width tdT does not significantly change the nominal breakdown voltage BVDSS_nom in the termination mesa 190. The process window for the width dT of the termination mesa 190 is rather non-problematic.

Figure 4A:
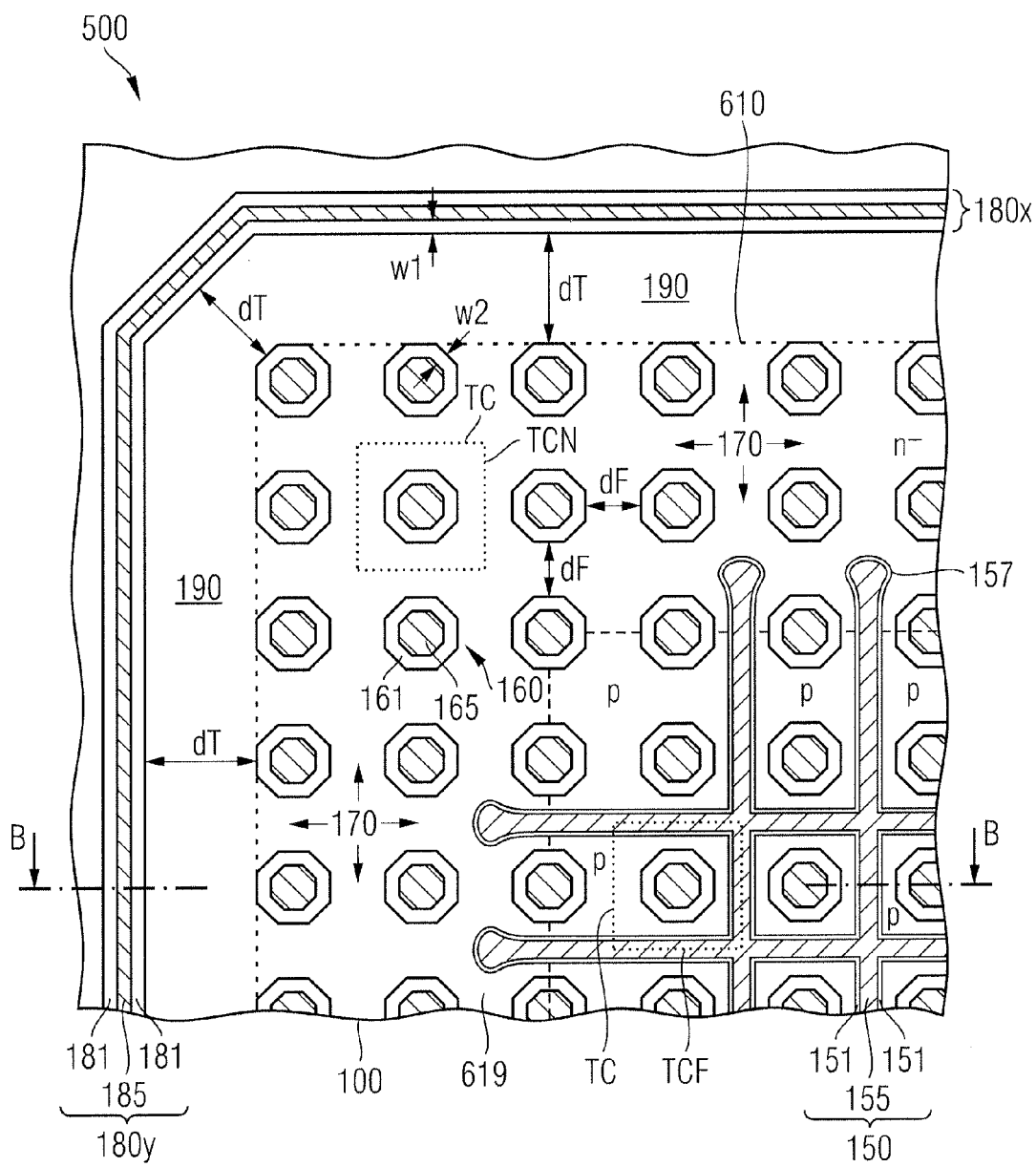
FIG. 4A is a schematic horizontal cross-sectional view of a portion of a semiconductor device according to an embodiment related to a termination structure with beveled corners and gate structures in gate trenches.
Figure 4B:
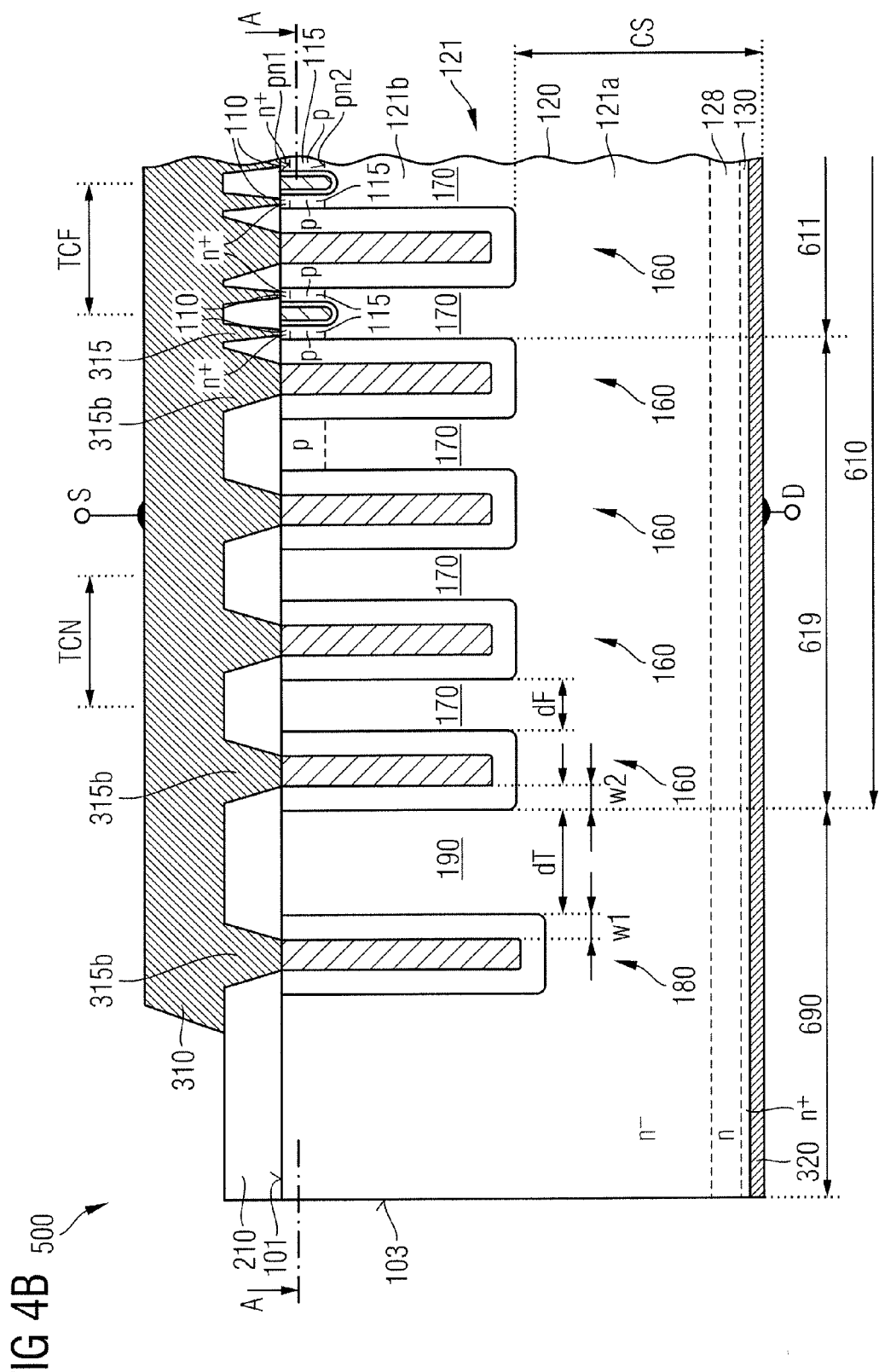
FIG. 4B is a schematic vertical cross-sectional view of the semiconductor device portion of FIG. 4A along line B-B.

FIGS. 4A and 4B refer to a semiconductor device 500 with a termination structure 180 including a first straight section 180x and a second straight section 180y orthogonal to the first straight section 180x. The termination mesa 190 comprises slanted sections connecting two orthogonal straight sections, respectively.

A semiconductor body 100 as described in detail with reference to FIGS. 1A and 1B includes a drain structure 120 of the first conductivity type as well as a contact portion 130 of the first conductivity type between the drain structure 120 and the second surface 102. The drain structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between 1E15 cm$^{-3}$ and 1E17 cm$^{-3}$, for example in a range from 5E15 cm$^{-3}$ to 5E16 cm$^{-3}$. The drain structure 120 may include further doped zones, for example a field stop layer 128 that separates the drift zone 121 from the contact portion 130. A mean dopant concentration in the field stop layer 128 may be at least five times as high as a mean dopant concentration in the drift zone 121 and at most one-fifth of a maximum dopant concentration in the contact portion 130.

The contact portion 130 may be a heavily doped base substrate or a heavily doped layer. Along the second surface 102 a dopant concentration in the contact portion 130 is sufficiently high to form an ohmic contact with a metal directly adjoining the second surface 102. In case the semiconductor body 100 is based on silicon, in an n-conductive contact portion 130 the dopant concentration along the second surface 102 may be at least 1E18 cm$^{-3}$, for example at least 5E19 cm$^{-3}$, whereas in a p-conductive contact portion 130 the dopant concentration may be at least 1E18 cm$^{-3}$, for example at least 5E18 cm$^{-3}$.

In a cell field 610, field electrode structures 160 are regularly arranged in lines and columns at equal distances. According to the illustrated embodiment, the field electrode structures 160 are arranged matrix-like in a checkerboard pattern. Along the lines and rows, the field electrode structures 160 are spaced at a width dF. As regards further details of the field electrode structures 160 reference is made to the detailed description in FIGS. 1A and 1B.

Transistor cells TC are centered on a horizontal center point CP of the respective field electrode structures 160. Semiconducting portions of the transistor cells TC are formed in cell mesas 170 between the field electrode structures 160. The cell mesas 170 include a second drift zone section 121b directly adjoining a first drift zone section 121a formed in a contiguous portion CS of the semiconductor body 100 between the bottom plane BPL and the second surface 102.

Transistor cells TC in a central portion 611 are functional transistor cells TCF with the cell mesas 170 including source zones 110 and a body zone 115 forming first pn junctions pn1 with the source zones 110 and a second pn junction pn2 with the drift zone 121.

The source zones 110 may be wells extending from the first surface 101 into the semiconductor body 100, for example into the body zones 115. According to an embodiment, one source zone 110 surrounds the field electrode structure 160 of a functional transistor cell TCF in a horizontal plane. The source zone(s) 110 may directly adjoin the respective field electrode structure 160 or may be spaced from the field electrode structure 160. According to other embodiments, the field electrode structure 160 of the concerned functional transistor cell TC is not completely surrounded by one source zone 110 or includes several spatially separated rotational symmetric source zones 110.

Transistor cells TC in a transition area 619 surrounding the central portion 611 are nonfunctional transistor cells TCN with the cell mesas 170 devoid of source zones 110 or devoid of source and body zones 115. Instead, a portion of the drift zone 121 may completely fill the concerned cell mesas 170.

The central portion 611 further includes a gate structure 150 with a conductive gate electrode 155 surrounding transistor sections of the functional transistor cells TCF in a horizontal plane, wherein the transistor sections are portions of the cell mesas 170 including the source and body zones 110, 115. According to the illustrated embodiment, the gate structure 150 is spaced from the field electrode structure 160. The gate electrode 155 includes or consists of a heavily doped polycrystalline silicon layer and/or a metal-containing layer.

The gate electrode 155 is completely insulated against the semiconductor body 100, wherein a gate dielectric 151 separates the gate electrode 155 at least from the body zone 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate structure 150 may be a lateral gate formed outside the semiconductor body 100 along the first surface 101. According to the illustrated embodiment the gate structure 150 is a trench gate extending from the first surface 101 into the semiconductor body 100.

In the illustrated embodiments and for the following description, the first conductivity type is n-type and the second conductivity type is p-type. Similar considerations as outlined below apply also to embodiments with the first conductivity type being p-type and the second conductivity type being n-type.

When a voltage applied to the gate electrode 150 exceeds a preset threshold voltage, electrons accumulate in the channel portions directly adjoining the gate dielectric 151 and form inversion channels short-circuiting the second pn junction pn2 for electrons.

A vertical extension of the gate structure 150 is smaller than the vertical extension of the field electrode structures 160. According to an embodiment, the vertical extension of the gate structure 150 may be in a range from 400 nm to 1500 nm, for example in a range from 500 nm to 1000 nm.

According to the illustrated embodiment the gate structure 150 forms a grid which meshes surround the field electrode structures 160 and portions of the cell mesas 170 including the source and body zones 110, 115. According to other embodiments, the gate structure 150 may directly adjoin the field electrode structures 160.

The gate structure 150 may extend into the transition area 619, where the gate structure 150 may include expansions 157 for electrically contacting the gate electrode 155 with a metal gate electrode at the front side and outside the vertical projection of the central portion 611.

An interlayer dielectric 210 adjoining the first surface 101 may electrically insulate the gate electrode 155 from a first load electrode 310 arranged at the front side. In addition, the interlayer dielectric 210 may be formed in the vertical projection of the field electrode structures 160.

The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to a first load terminal, for example the source terminal S in case the semiconductor device 500 is an IGFET. A second load electrode 320, which directly adjoins the second surface 102 and the contact portion 130, may form or may be electrically connected to a second load terminal, which may be the drain terminal D in case the semiconductor device 500 is an IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the source and body zones 110, 115 of the transistor cells TC. Ancillary contact structures 315b may electrically connect the first load electrode 310 with the field electrodes 165 and the termination electrode 185. The contact structures 315, 315b may include one or more conductive metal containing layers based on, e.g., titanium (Ti) or tantalum (Ta) and a metal fill portion, e.g., based on tungsten (W). According to other embodiments the contact structures 315, 315b include heavily doped semiconductor structures, e.g., heavily n-doped polycrystalline structures or heavily p-doped columnar single crystalline structures.

The field electrodes 165 as well as the termination electrode 185 may be electrically connected to the first load electrode 320, to the gate electrodes 155, to another terminal of the semiconductor device 500, to an output of an internal driver circuit, or may electrically float.

The field electrode structures 160 allow higher dopant concentrations in the drift zone 121 without adversely affecting the blocking capability of the semiconductor device 500. The needle-shaped field electrodes 165 increase the available cross-sectional area for the drift zone 121 and therefore reduce the on-state resistance RDSon compared to stripe-shaped field electrodes. The wide termination mesa 170 ensures that avalanche breakdown mainly occurs in the more robust cell field 610. Field and termination dielectrics 161, 181 with the same thickness w1=w2 reduce process complexity.

Figure 4C:
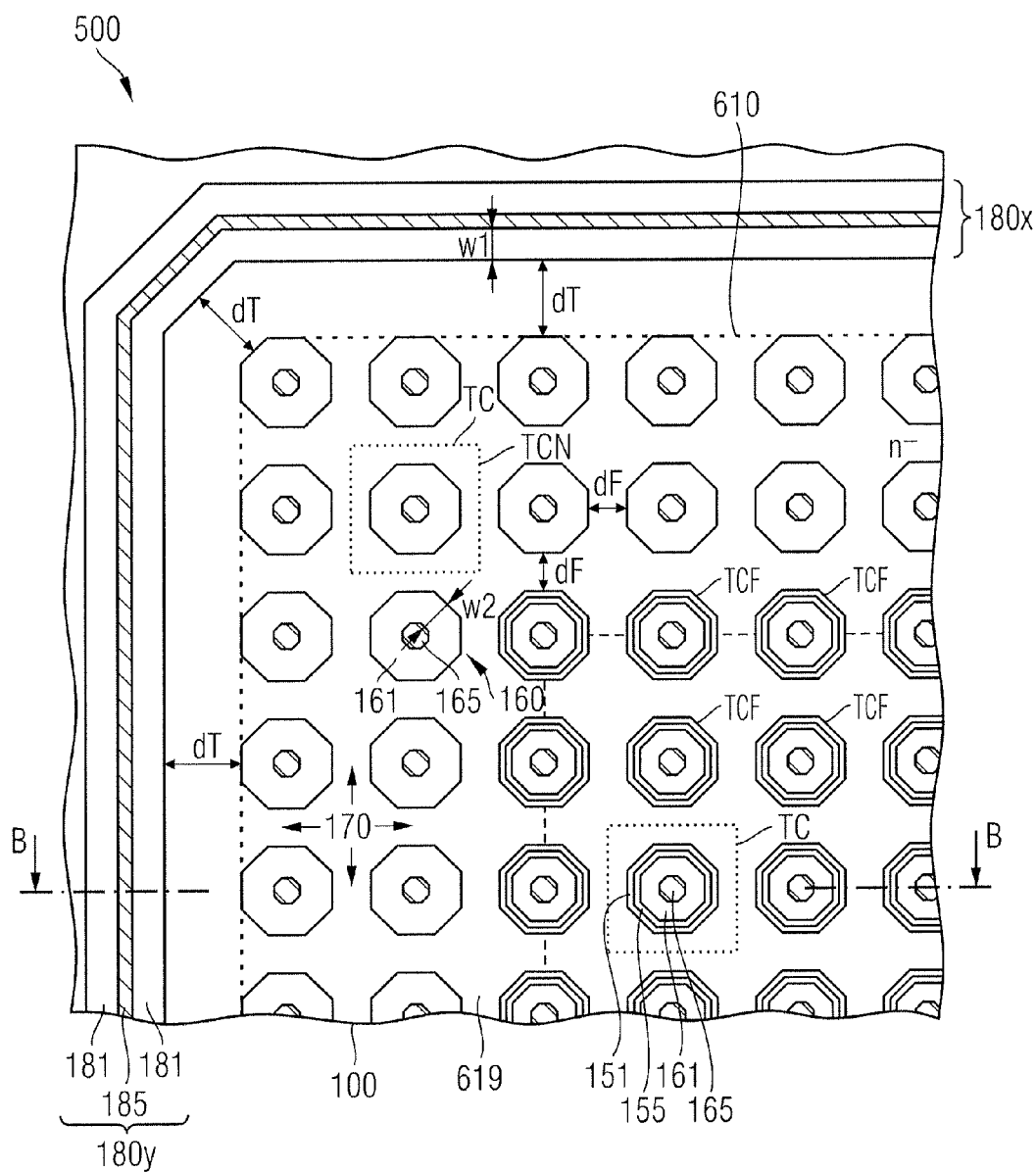
FIG. 4C is a schematic horizontal cross-sectional view of a portion of a semiconductor device according to a further embodiment related to a termination structure with beveled corners and gate structures embedded in field dielectrics.

The semiconductor device 500 illustrated in FIGS. 4C and 4D includes gate structures 150 embedded in the field dielectrics 161. The field dielectrics 161 of semiconductor devices 500 specified for high blocking voltages are comparatively thick and embedding the gate structures 150 in portions of thick field dielectrics 161 may save chip area and/or relax design constraints.

Figure 5A:
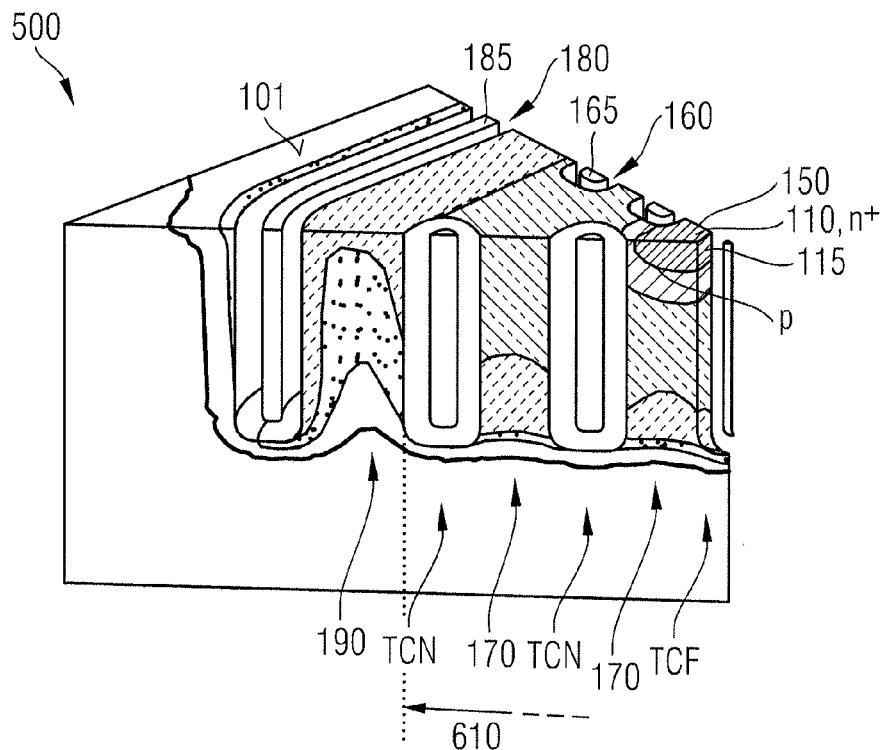
FIG. 5A is a schematic perspective cross-sectional view of a portion of a semiconductor device according to an embodiment with beveled corners for illustrating effects of the embodiments.
Figure 5B:
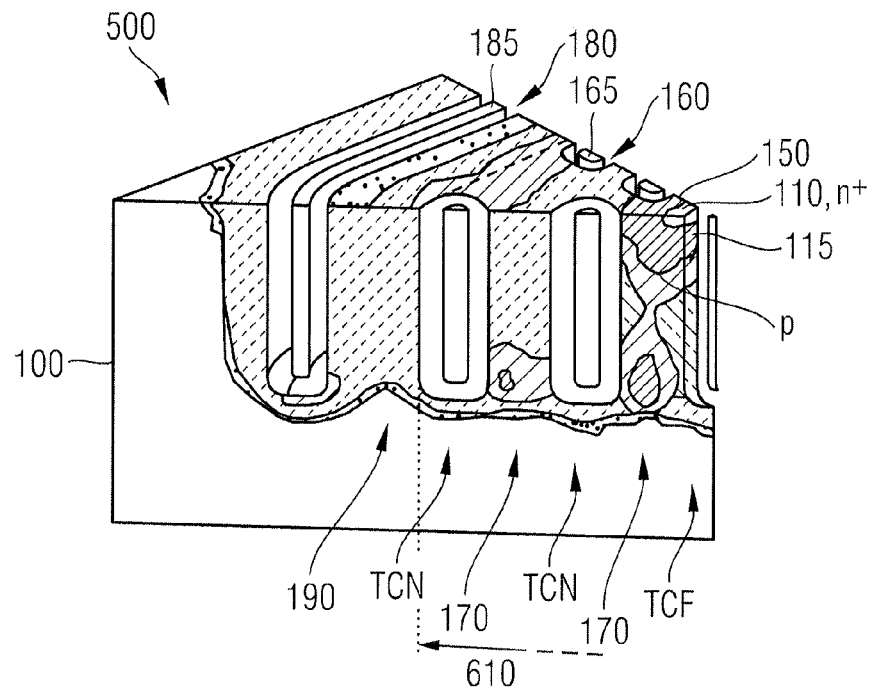
FIG. 5B shows charge carrier generation in the semiconductor device portion of FIG. 5A at avalanche breakdown.

FIGS. 5A and 5B refer to a semiconductor device 500 with the termination structure 180 forming a frame with beveled corners around the cell field 610. The cell field 610 includes functional and non-functional transistor cells TCF, TCN arranged matrix-like in lines and rows orthogonal to the lines. The cross-sectional plane follows a bisecting line of one of the corners of the cell field 610.

FIG. 5A shows the electric field distribution in the semiconductor body 100 at the avalanche breakdown. The denser the shading of a semiconductor region, the more the potential of the concerned semiconductor region approximates the potential of the source electrode. The sparser the shading is, the more the respective potential approximates to that of the drain electrode. On the first surface 101, the electric field gradually decreases in the horizontal direction between an outer surface 103 of the semiconductor body 100 and the cell field 610.

In FIG. 5B dense shading represents a high generation rate at the avalanche breakdown and sparse shading corresponds to a low generation rate. Beveled corners of the frame-shaped termination structure 180 keep the width of the termination mesa 180 uniform along the complete circumference and increases avalanche ruggedness of the corner portions. The avalanche generation predominantly takes place within the cell field 610.

Figure 5C:
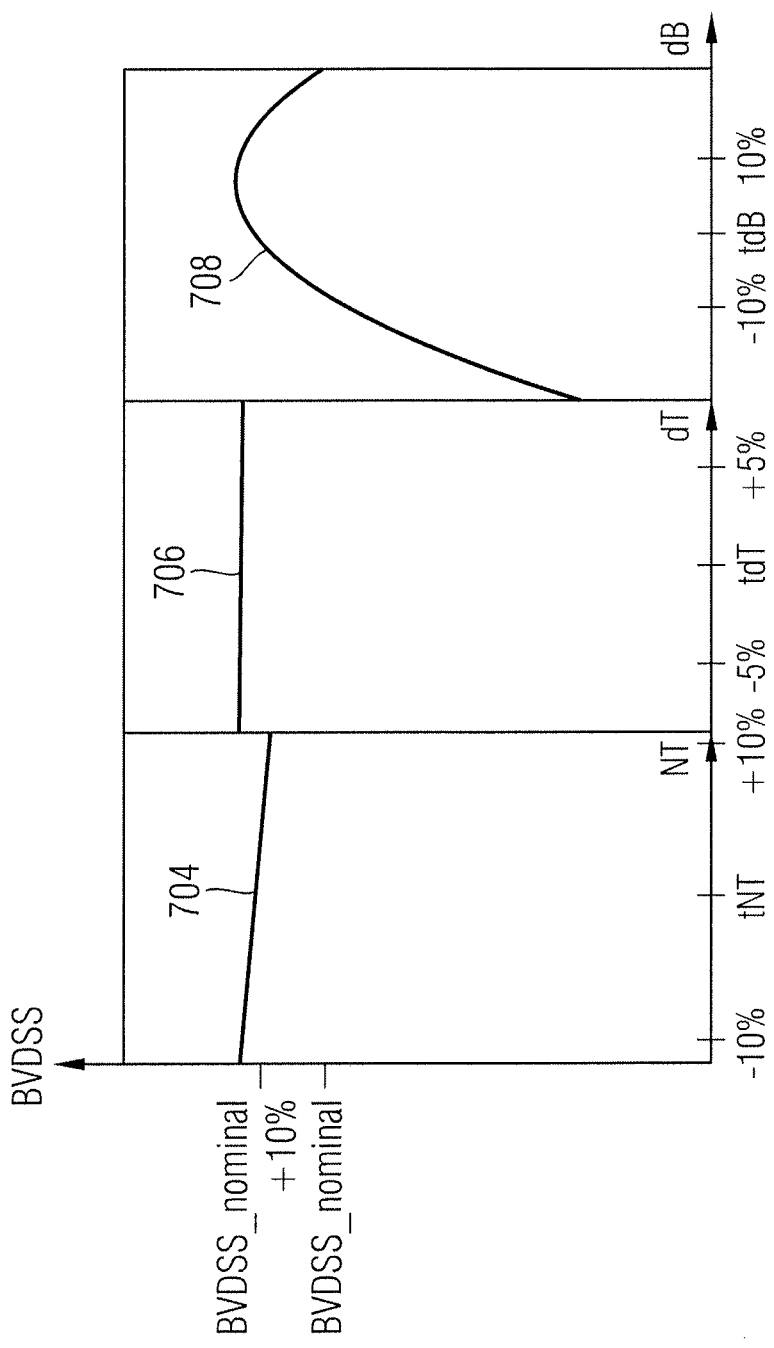
FIG. 5C is a schematic diagram illustrating process windows related to the semiconductor device of FIGS. 5A and 5B.

FIG. 5C shows a process window for the breakdown voltage BVDSS as a function of the doping NT in the termination mesa, the width dT of the termination mesa 180, and the distance dB of the body zone of the transistor cell from a lateral center of the transistor cell. A first window section 704 plots the breakdown voltage BVDSS as a function of the doping NT in the termination mesa on the left hand side. In the center a second process window section 706 plots the breakdown voltage BVDSS as a function of the width dT of the termination mesa 180. A third window section 708 plots the breakdown voltage BVDSS as a function of the distance dB of the body zones from a lateral center of the transistor cell on the right hand side.

According to the first process window 704 the breakdown voltage VBDSS changes by less than 2% across a variation of the doping concentration NT in the termination mesa around a target value tNT of ±10%. The second process window 706 shows that the breakdown voltage varies by less than 2% across a width variation of the termination mesa 190 around a target width tdF. The third process window reveals that a deviation from a target value tdB of 10% of the distance dB of the body zones from the center axis of the respective transistor cell may result in a variation of the breakdown voltage BVDSS of more than 10%.

Figure 6A:
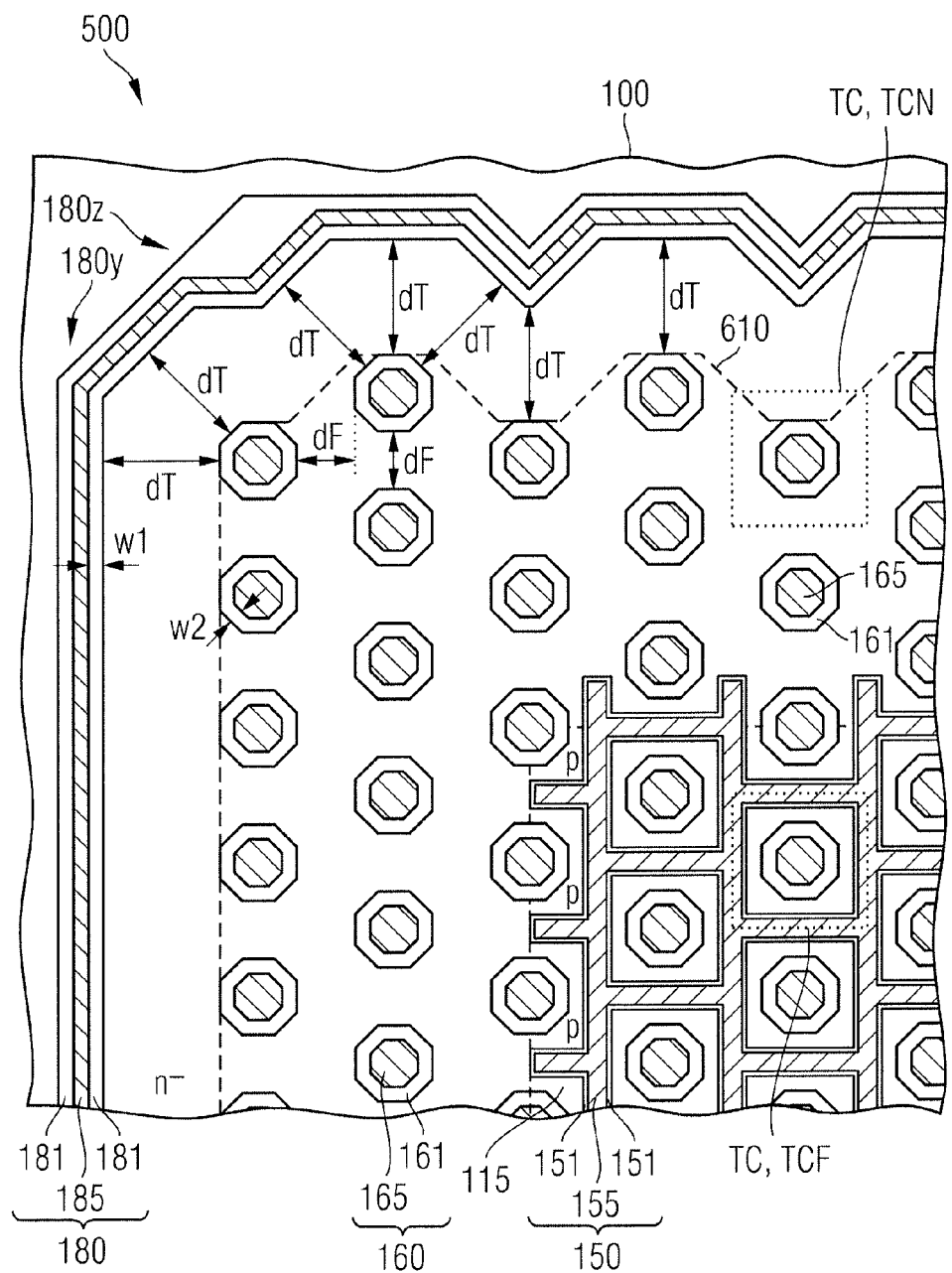
FIG. 6A is a schematic horizontal cross-sectional view of a portion of a semiconductor device in accordance with an embodiment related to octagonal field electrode structures arranged in shifted lines and to a termination structure of approximately constant width.
Figure 6B:
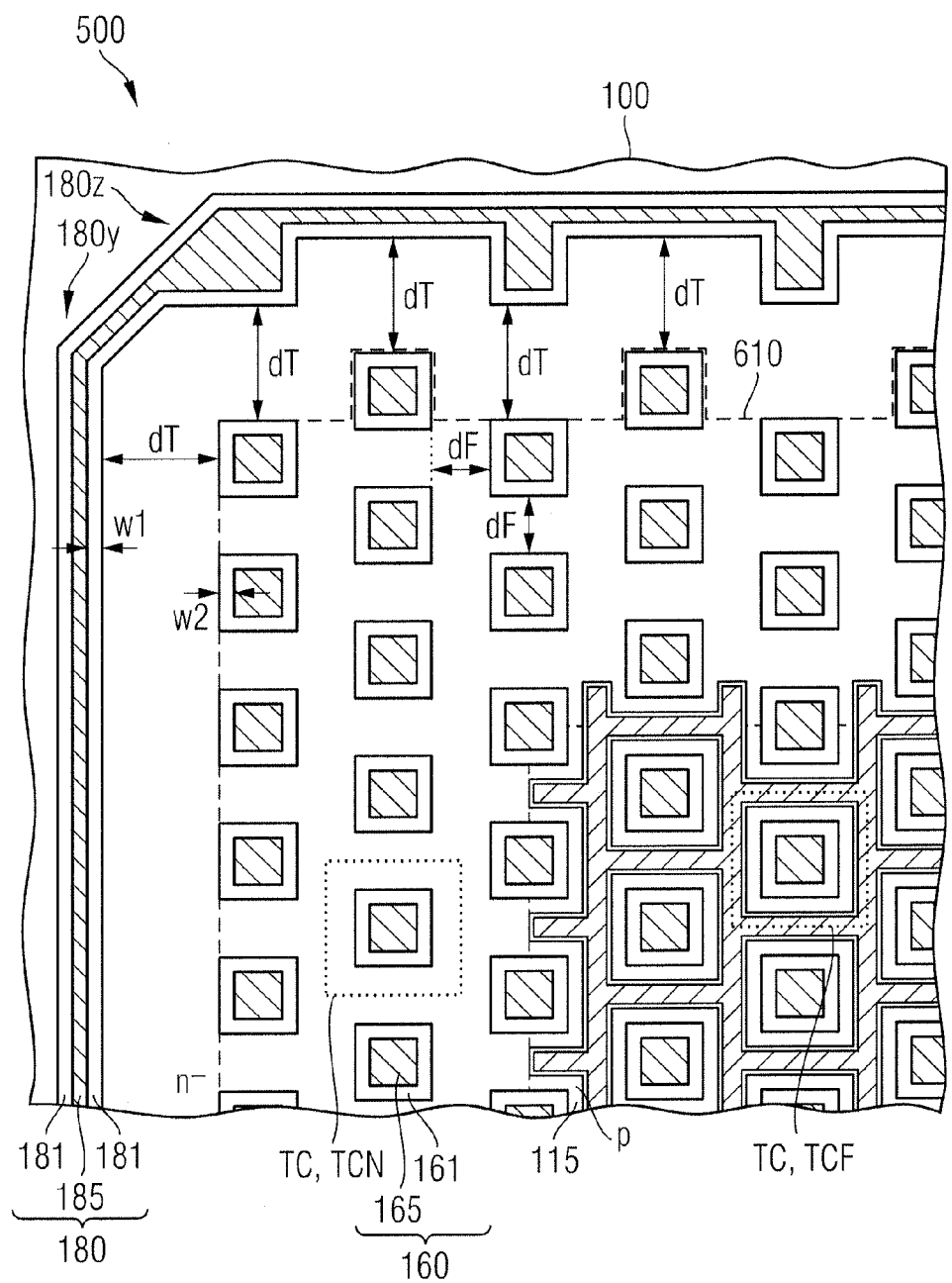
FIG. 6B is a schematic horizontal cross-sectional view of a portion of a semiconductor device in accordance with an embodiment related to square field electrode structures arranged in shifted lines and to a termination structure with rectangular bulges.

FIGS. 6A and 6B refer to layouts with the transistor cells TC and field electrode structures 160 arranged in shifted lines, wherein the odd lines are shifted to the even lines by one half of the distance between two neighboring transistor cells TC or two neighboring field electrode structures 160.

According to the embodiment of FIG. 6A the inner contour of the termination structure 180 follows the contour line of the cell field 610. A width of the termination structure 180 may vary or may be approximately uniform. As a result, the termination structure 180 includes long straight sections 180y extending parallel to the lines of field electrode structures 160 and zigzag sections 180z oriented orthogonal to the long straight sections 180y.

FIG. 6B refers to an embodiment with approximately square field electrode structures 160 and a termination structure 180 with rectangular bulges along the inner contour in the projection of the indented lines. The inner contour of the frame-like termination structure 180 follows a contour of the cell field 610 approximated by orthogonal lines. According to further embodiments, transitions between orthogonal portions of the termination structure 180 or transitions to slanted, non-orthogonal sections may be rounded.

Figure 7:
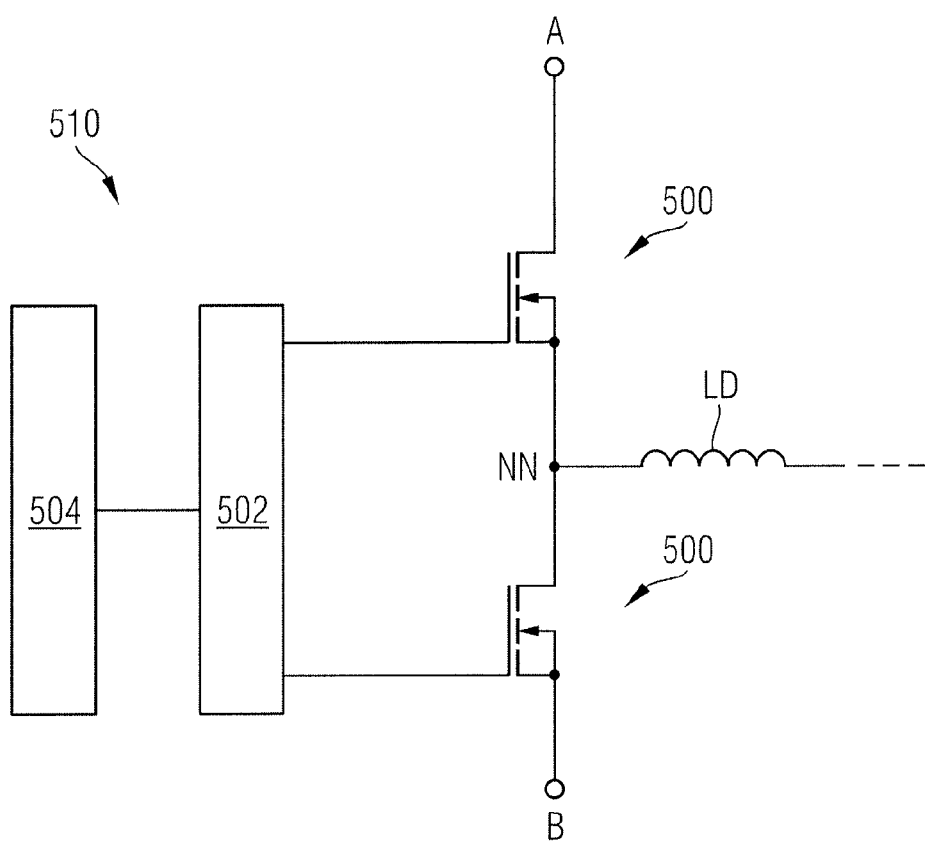
FIG. 7 is a simplified circuit diagram of an electronic circuit according to a further embodiment.

FIG. 7 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly 510 may further include a control circuit 504 that supplies a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

FIGS. 8A to 8F refer to a method of manufacturing a semiconductor device as described above.

Figure 8A:
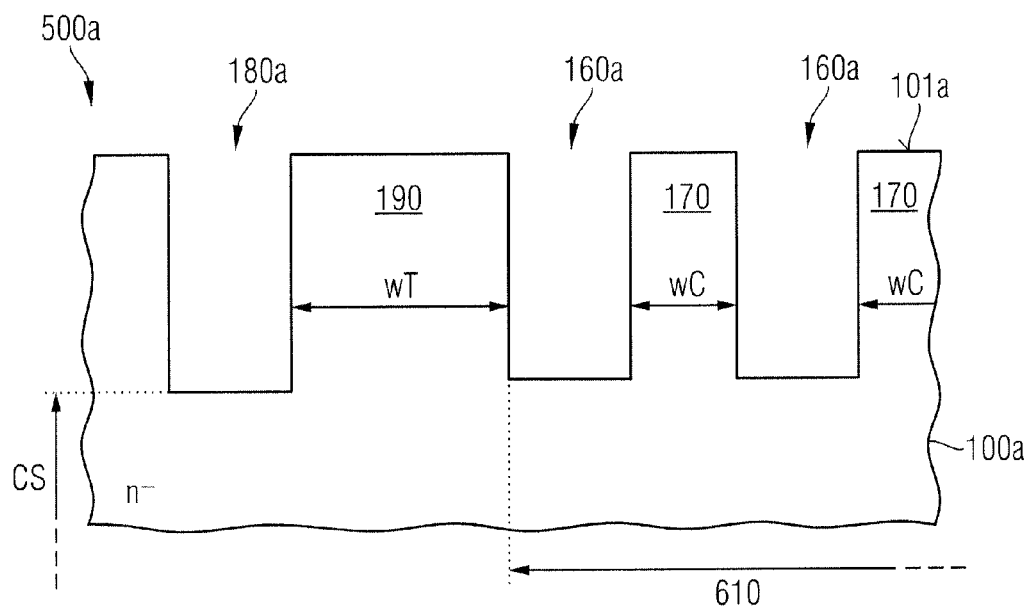
FIG. 8A is schematic cross-sectional view of a portion of a semiconductor substrate for illustrating a method of manufacturing a semiconductor device according to an embodiment, after forming a termination trench and field electrode trenches.

FIG. 8A shows a semiconductor substrate 500a consisting of or containing a semiconductor layer 100a of a single-crystalline semiconductor material. The semiconductor substrate 500a may be a semiconductor wafer from which a plurality of identical semiconductor dies is obtained. The single crystalline semiconductor material of the semiconductor layer 100a may be silicon (Si), by way of example.

A perpendicular to a main surface 101a of the semiconductor layer 100a defines a vertical direction and directions orthogonal to the vertical direction are horizontal directions.

The semiconductor layer 100a contains dopants of a first conductivity type. For example, the semiconductor layer 100a is based on lightly n-doped silicon containing phosphorus (P) and/or arsenic (As) atoms. The dopants may be uniformly distributed in the semiconductor layer 100a. According to other embodiments, the dopant concentration in the semiconductor layer 100a may gradually decrease or increase with increasing distance to the main surface 101a at least in sections. A mean dopant concentration in the semiconductor layer 100a may be between $1E15$ $cm^{-3}$ and $1E17$ $cm^{-3}$, for example in a range from $5E15$ $cm^{-3}$ to $5E16$ $cm^{-3}$.

In a cell field 610 field electrode trenches 160a are formed that extend from the main surface 101a into the semiconductor layer 100a. Outside the cell field 610 a stripe-shaped termination trench 180a is formed that completely surrounds the cell field 610. The termination trench 180a and the field electrode trenches 160a may be contemporaneously formed by sharing the same lithographic exposure process and by using the same etch mask and etch process.

The field electrode trenches 160a shown in FIG. 8A may be needle-shaped trenches arranged matrix-like in lines and rows. A horizontal cross-section of a field electrode trench 160a may be a circle or a polygon with our without rounded or beveled corners, for example, a square, a hexagon or an octagon with or without beveled corners.

A vertical extension of the termination and field electrode trenches 180a, 160a may be in a range from 0.5 µm to 50 µm, for example from 0.6 µm to 4 µm. A horizontal width of the termination and field electrode trenches 180a, 160a may be in a range from 0.4 µm to 10 µm, for example in a range from 0.6 µm to 4 µm. The termination and field electrode trenches 180a, 160a may have the same width. According to other embodiments, the termination trench 180a may be wider and/or deeper than the field electrode trenches 160a.

Portions of the semiconductor layer 100a separating the field electrode trenches 160a from each other form cell mesas 170. A portion of the semiconductor layer 100a separating the outermost field electrode trenches 160a of the cell field 610 from the termination trench 180*a* form a termination mesa 190. The cell mesas 170 as well as the termination mesa 190 protrude from a contiguous section CS of the semiconductor substrate 500*a*. A width dT of the termination mesa 190 is greater than a width dF of the cell mesas 170.

According to an embodiment, a sacrificial oxide layer 202 may be formed by thermal oxidation, e.g., by heating the semiconductor substrate 500*a* in an ambient containing oxygen.

Figure 8B:
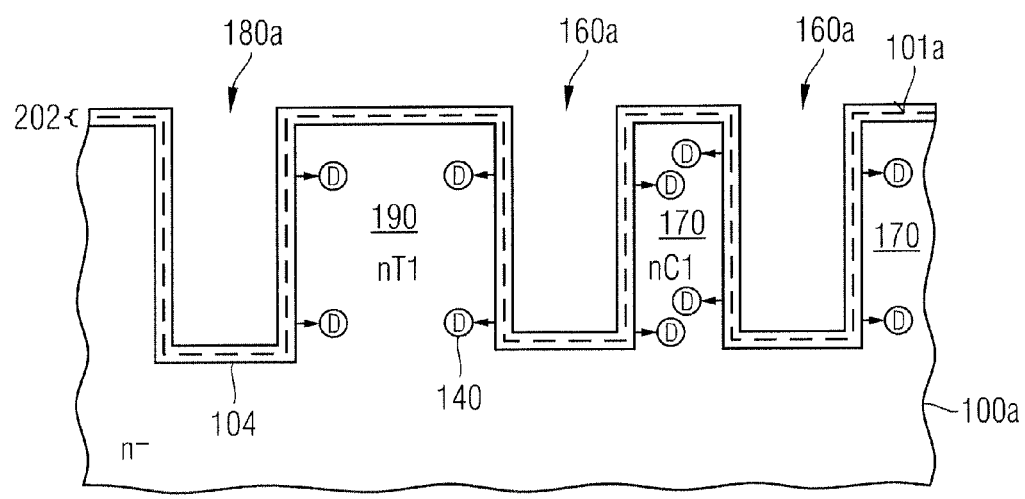
FIG. 8B is a schematic cross-sectional view of the semiconductor substrate portion of FIG. 8A, after forming a sacrificial oxide layer.

FIG. 8B shows the sacrificial oxide layer 202 equably lining the termination and field electrode trenches 180*a*, 160*a*. Dopant atoms 140 from portions 104 of the semiconductor layer 100*a* consumed by the formation of the sacrificial oxide layer 202 diffuse into the adjoining termination and cell mesas 190, 170. Since the dopant atoms 140 diffusing from vertical portions of the sacrificial oxide layer 202 distribute over a greater volume, the resulting total dopant concentration nT1 in the termination mesa 190 is lower than the resulting total dopant concentration nC1 in the cell mesas 170. Then the sacrificial oxide layer 202 is removed.

Figure 8C:
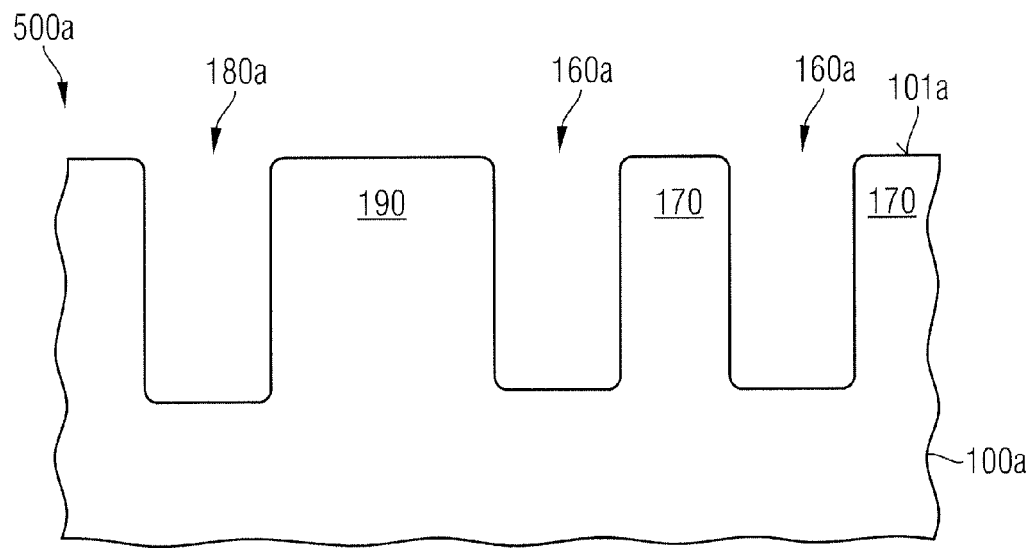
FIG. 8C is a schematic cross-sectional view of the semiconductor substrate portion of FIG. 8B, after removing the sacrificial oxide layer.

As illustrated in FIG. 8C, formation and removal of the sacrificial oxide layer 202 rounds edges at the openings and bottoms of the termination and field electrode trenches 180*a*, 160*a*. Other embodiments may get along without formation and removal of a sacrificial oxide layer 202.

A field oxide layer 161*a* may be formed by thermal oxidation, e.g., by heating the semiconductor substrate 500*a* in an ambient containing oxygen.

Figure 8D:
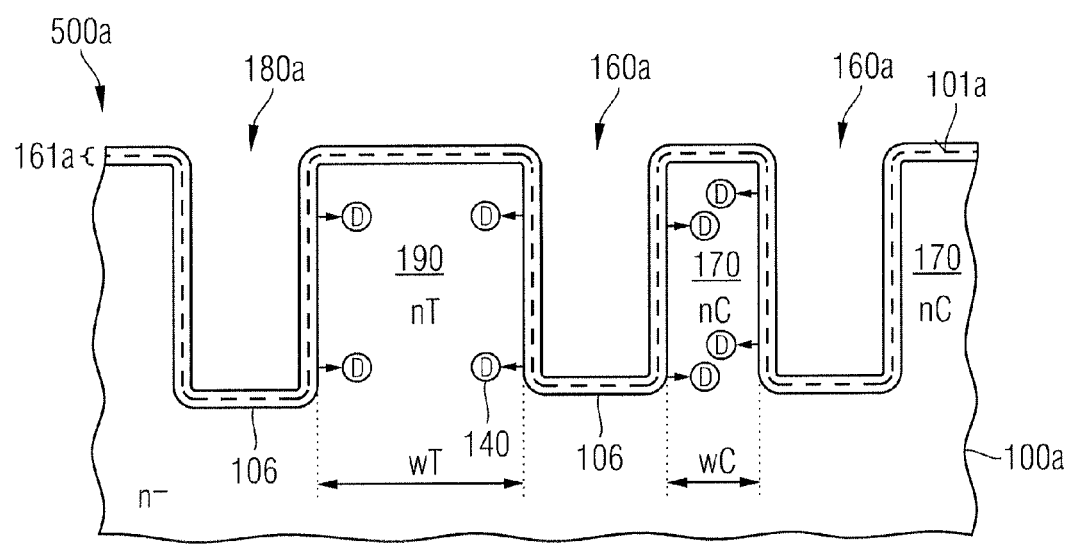
FIG. 8D is a schematic cross-sectional view of the semiconductor substrate portion of FIG. 8C, after forming a field oxide layer.

FIG. 8D shows the field oxide layer 161*a* lining the rounded termination and field electrode trenches 180*a*, 160*a*. Dopant atoms contained in oxidizing portions of the semiconductor layer 100*a* segregate and contribute to final dopant concentrations nC, nT in the cell mesas 170 and the termination mesa 190. A dopant concentration difference between a final first dopant concentration nC in the cell mesas 170 and a final second dopant concentration nT in the termination mesa 190 may be proportional to a ratio of a width dF of the cell mesas 170 to a width dF of the termination mesa 190.

According to an embodiment, a conformal field dielectric layer 161*b* of uniform layer thickness may be deposited on the field oxide layer 161*a* using a predominantly conformal deposition process.

Figure 8E:
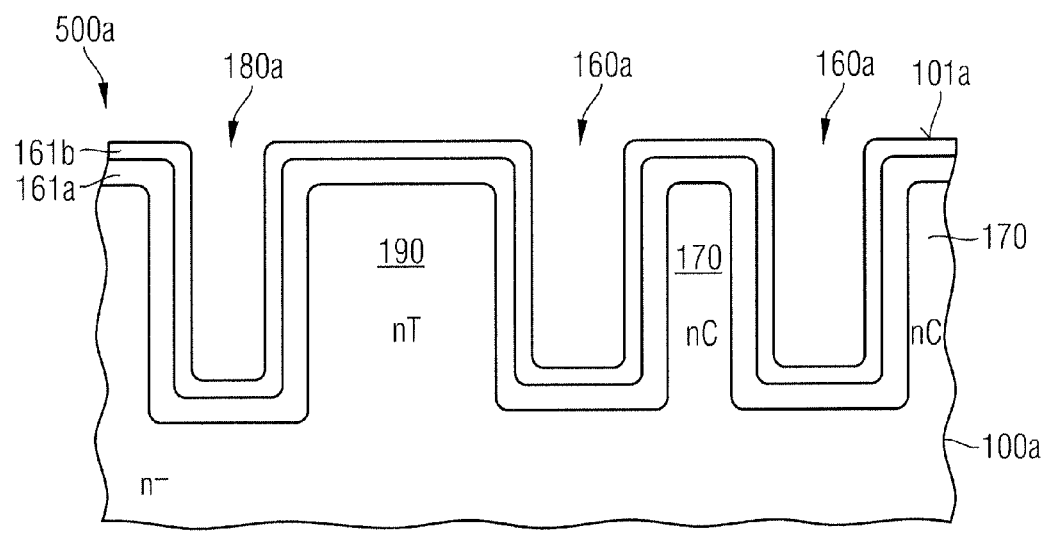
FIG. 8E is a schematic cross-sectional view of the semiconductor substrate portion of FIG. 8D, after depositing a field dielectric layer.

FIG. 8E shows the conformal field dielectric layer 161*b* of uniform layer thickness. The field dielectric layer 161*b* may be, for example, deposited silicon oxide such as silicon oxide obtained by using TEOS (tetraethyl orthosilicate) as precursor material. According to other embodiments, the field dielectric layer 240 may include a silicon nitride layer, a silicon oxynitride layer or another dielectric material. A layer thickness of the field dielectric layer 161*b* may be in a range from 10% to 90% of the overall oxide thickness, for example in a range from 40% to 60%

The layer stack comprising the field oxide layer 161*a* and the field dielectric layer 161*b* may be removed from at least an central portion 611. Gate trenches may be formed in the cell mesas 170 and may be lined with a gate dielectric 151. A conductive material may be deposited and recessed to fill the gate trenches, the termination trenches 180*a* as well as the field electrode trenches 160*a*. Impurities may be implanted to form heavily doped source zones 110 and oppositely doped body zones 115.

Figure 8F:
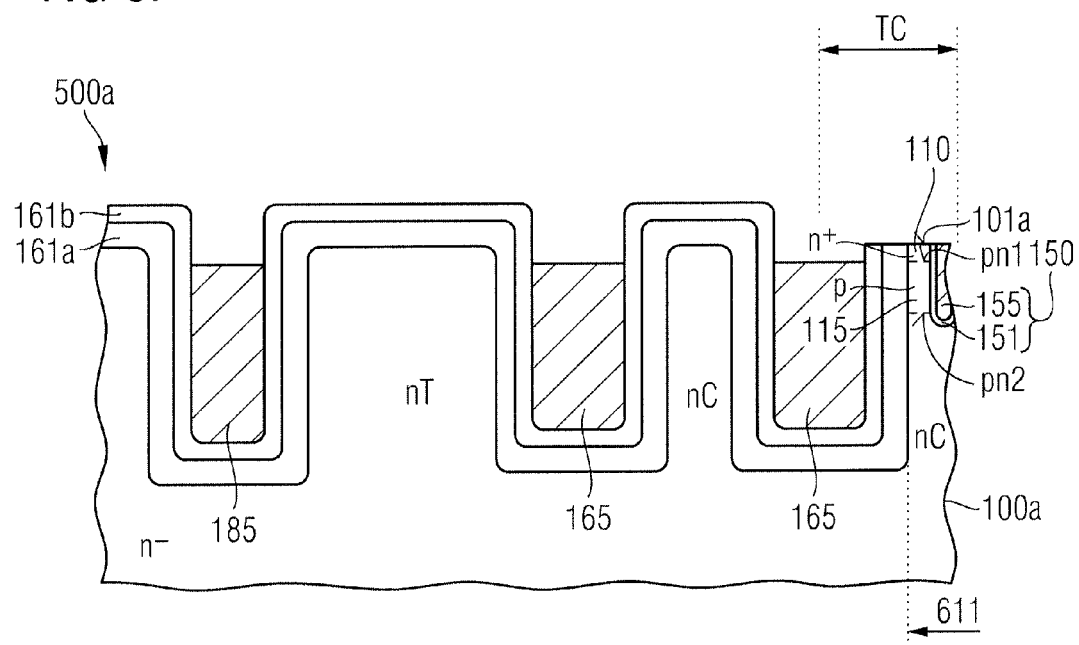
FIG. 8F is a schematic cross-sectional view of the semiconductor substrate portion of FIG. 8E, after depositing a field electrode material.

FIG. 8F shows transistor cells TC with a gate electrode structure 150 with a gate electrode 155 and a gate dielectric 151 separating the gate electrode 155 from the semiconductor layer 100*a*. In the central portion 611, a body zone 115 form first pn junctions pn1 with source zones 110 and a second pn junction pn2 with a drift zone 121 formed from further portions of the doped semiconductor layer 100*a*. The deposited conductive material forms field electrodes 165 in the field electrode trenches 160*a*, a termination electrode 185 in the termination trench 180*a* and gate electrode 155 in the gate trenches 150*a*. Further processes are applied to the semiconductor substrate 500*a*. Finally a plurality of identical semiconductor devices as described with reference to the other Figures are obtained by dividing the semiconductor substrate 500*a* into a plurality of identical semiconductor dies.

Formation of the sacrificial oxide layer 202, the field oxide layer 161*a* and the field dielectric layer 161*b* may be used to adjust, at a given total thickness of the field oxide layer 161*a* and the field dielectric layer 161*a*, the final second dopant concentration nT in the termination mesa 190 which is lower than the final first dopant concentration in the cell mesas 170 to ensure that the avalanche takes place within the cell field 610. For providing the concentration difference segregation of dopant atoms from the growing oxide layers is used.

If a field oxide layer 161*a*, which is thinner than the final field dielectric, is sufficient to generate the desired dopant difference, a deposited field dielectric layer may supplement the field oxide layer 161*a* to the final field dielectric without further increasing the dopant difference. If a field oxide layer 161*a* with the final field dielectric thickness is not sufficient to generate the desired dopant difference, formation and removal of a sacrificial oxide layer may add to the dopant difference without further increasing the thickness of the final field dielectric.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a cell field comprising a plurality of field electrode structures arranged in lines and cell mesas separating neighboring ones of the field electrode structures from each other, wherein each field electrode structure comprises a field electrode and a field dielectric separating the field electrode from a semiconductor body;
wherein the cell field comprises a functioning zone and a non-functioning zone, wherein the functioning zone comprises functional transistor cells comprising one or more of the plurality of field electrode structures, source zones of a first conductivity type and body zones of a second conductivity type that is complementary of the first conductivity type, and wherein the non-functioning zone comprises non-functional transistor cells comprising one or more of the plurality of field electrode structures wherein the cell mesas separating field electrode structures in non-functional transistor cells do not include a source zone of the first conductivity type;
a termination structure surrounding the cell field, extending from a first surface into the semiconductor body, and comprising a termination electrode and a termination dielectric separating the termination electrode from the semiconductor body, the termination and field dielectrics having a same thickness; and a termination mesa wider than the cell mesas and separating the termination structure from the non-functioning zone of the cell field, wherein the termination mesa touches both the non-functioning zone of the cell field and the termination structure.

2. The semiconductor device of claim 1, wherein a mean dopant concentration in the termination mesa is lower than a mean dopant concentration in a second drift zone section in the cell mesas, the second drift zone section directly adjoining a first drift zone section formed in a contiguous section of the semiconductor body between the field electrode structures and a second surface opposite to the first surface.

3. The semiconductor device of claim 1, further comprising:

a gate structure surrounding the field electrode structures, the gate structure comprising a gate electrode and a gate dielectric separating the gate electrode from the semiconductor body.

4. The semiconductor device of claim 3, wherein portions of the cell mesas are formed between the gate structure and the field electrode structures, respectively.

5. The semiconductor device of claim 4, wherein the gate structure forms a grid embedding transistor sections of a plurality of transistor cells, each transistor cell assigned to a field electrode structure.

6. The semiconductor device of claim 1, wherein a width of the field electrode structures is equal to a width of the termination structure.

7. The semiconductor device of claim 1, wherein a width of the termination mesa is uniform along straight sections of the termination mesa.

8. The semiconductor device of claim 1, wherein a width of the termination mesa is uniform along beveled portions between orthogonal straight sections of the termination mesa.

9. The semiconductor device of claim 1, wherein a distance between the termination structure and the cell field is uniform.

10. The semiconductor device of claim 1, wherein the field electrode structures are arranged matrix-like in lines and rows orthogonal to the lines, and the termination mesa comprises at least four straight sections along four sides of a rectangular cell field.

11. The semiconductor device of claim 10, wherein the termination mesa comprises slanted sections connecting two orthogonal straight sections, respectively.

12. The semiconductor device of claim 1, wherein the field electrode structures are arranged in shifted lines, and the termination mesa comprises straight sections parallel to the shifted lines and zigzag sections orthogonal to the shifted lines.

13. The semiconductor device of claim 12, wherein the zigzag sections of the termination mesa comprise bulges in the longitudinal projection of indented lines of field electrode structures.

14. The semiconductor device of claim 12, wherein the zigzag sections have uniform width.

15. An electronic assembly, comprising:

a semiconductor device that comprises a cell field comprising a plurality of field electrode structures arranged in lines and cell mesas separating neighboring ones of the field electrode structures from each other, wherein each field electrode structure comprises a field electrode and a field dielectric separating the field electrode from a semiconductor body;

wherein the cell field comprises a functioning zone and a non-functioning zone, wherein the functioning zone comprises functional transistor cells comprising one or more of the plurality of field electrode structures, source zones of a first conductivity type and body zones of a second conductivity type that is complementary of the first conductivity type, and wherein the non-functioning zone comprises non-functional transistor cells comprising one or more of the plurality of field electrode structures wherein the cell mesas separating field electrode structures in non-functional transistor cells do not include a source zone of the first conductivity type;

a termination structure surrounding the cell field, extending from a first surface into the semiconductor body, and comprising a termination electrode and a termination dielectric separating the termination electrode from the semiconductor body, the termination and field dielectrics having a same thickness; and a termination mesa wider than the cell mesas and separating the termination structure from the non-functioning zone of the cell field, wherein the termination mesa touches both the non-functioning zone of the cell field and the termination structure.

* * * * *